United States Patent [19]
Kikuchi

[11] Patent Number: 5,729,231
[45] Date of Patent: Mar. 17, 1998

[54] DIGITAL-TO-ANALOG CONVERTER HAVING IMPROVED RESISTANCE TO VARIATIONS IN DC CURRENT GAIN

[75] Inventor: Kazuyuki Kikuchi, Tokyo, Japan

[73] Assignee: Mitsubishi Denki Kabushiki Kaisha, Tokyo, Japan

[21] Appl. No.: 727,004

[22] Filed: Oct. 8, 1996

[30]    Foreign Application Priority Data

Apr. 18, 1996 [JP] Japan ................................. 8-097086

[51] Int. Cl.$^6$ ........................................... H03M 1/66
[52] U.S. Cl. ................................. 341/144; 341/154
[58] Field of Search ................................. 341/154, 144, 341/153, 150

[56]    References Cited

U.S. PATENT DOCUMENTS

Re. 29,619   4/1978   Pastoriza ................. 341/154

*Primary Examiner*—Jeffrey A. Gaffin
*Assistant Examiner*—Peguy JeanPierre
*Attorney, Agent, or Firm*—Leydig, Voit & Mayer, Ltd.

[57]     ABSTRACT

A digital-to-analog converter includes a ladder circuit and transistors. A control voltage generating circuit is coupled to the transistors in a feedback configuration to control current flowing through the transistors. The control voltage generating circuit includes an operational amplifier coupled to a transistor. Using the control voltage generating circuit, the digital-to-analog converter of the present invention produces an analog output voltage resistant to variation in the DC forward current gain of the transistors.

15 Claims, 12 Drawing Sheets

DIGITAL-TO-ANALOG CONVERTER HAVING IMPROVED RESISTANCE TO VARIATIONS IN DC CURRENT GAIN

BACKGROUND OF THE INVENTION

1. Field of the Invention

The invention relates to a digital to analog converter (hereinafter referred to as D/A converter) suitable for integration.

2. Description of the Prior Art

FIG. 3 is an example of a circuit for showing an operational principle of a conventional D/A converter. The circuit comprises a ladder circuit comprising resistors and switching circuits. In FIG. 3, the circuit comprises a direct current reference voltage source 21 having a voltage V, resistors 311~317 having resistances R or 2R, switches 331, 332, 333, 334 ($S_1$, $S_2$, ... Sn) switched according to inputted bit information, constant current sources I 321, 322, 323, 324, an output voltage Vout of the D/A converter, an output terminal 70 from which an output voltage Vout is outputted, input terminals 341, 342, 343, 344, and binary digital input signals $b_1$, $b_2$, $b_{n-1}$, $b_n$, respectively, inputted into the input terminals 341, 342, 343, 344. Here, the switches $S_1$, $S_2$, ... Sn turn on when the binary digital input signals $b_1$, $b_2$, ... $b_{n-1}$, $b_n$ are "1", and turn off when the binary digital input signals $b_1$, $b_2$, ... $b_{n-1}$, $b_n$ are "0".

An operation of the D/A converter is explained below. FIG. 3 shows an example of an ideal D/A converter. First, in order to obtain the analog voltage Vout, impedances of respective nodes shown in FIG. 4 are obtained. FIG. 4 shows an example of a ladder circuit.

In FIG. 4, respective impedance of the right part of the ladder circuit seen from a point B1 and a point C1 is R, and impedance at a node A is considered to be a parallel circuit comprising the resistance R and a resistance 2R, which obtains the following equation:

$$R//2R = (2/3) \cdot R$$

(i) In case that the respective input digital data signals $b_1$, $b_2$, $b_{n-1}$, $b_n$ are 1, 0, 0, 0 as shown in FIG. 5, the output voltage is obtained as follows according to the above mentioned result. In FIG. 5, the switch $S_1$ turns on since the input digital signal $b_1$ is "1", while all of other switches $S_2$, ... $S_{n-1}$, S4 turn off since all the input digital signals $b_2$, ... $b_{n-1}$, $b_n$ are "0".

Therefore, a voltage drop $V_A$ between the direct current reference voltage source 21 and the node A caused by the resistor 311 is obtained as follows.

$$V_A = (2/3) \cdot R \cdot I$$

Thus, voltage drops $V_B$, $V_C$, $V_D$ after the stages of the node B are obtained as follows, respectively, $$V_B = \tfrac{1}{2} \times V_A$$
$$\vdots$$
$$V_C = \tfrac{1}{2} \times V_{C-1}$$
$$V_D = \tfrac{1}{2} \times V_C$$

Where, the voltage drop $V_{C-1}$ is a voltage drop at an immediately preceding node to a node of the voltage drop $V_C$. Thus, the voltage drops at respective resistors decrease by ½ as it goes down to the respective nodes B, C, and D.

Therefore, the analog output voltage Vout at the output terminal 70 is obtained by a general equation (1).

$$\text{Vout} = V - V_D = (\tfrac{1}{2}^{n-1}) \cdot (2/3) \cdot R \cdot I \cdot b_1 \tag{1}$$

Where, n is a positive integer number such as 1, 2, 3 ....

(ii) Next, the output voltage, when the input digital signals $b_1$, $b_2$, $b_{n-1}$, $b_n$, are 0, 1, 0, 0, respectively, as shown in FIG. 6, is obtained as follows. In FIG. 6, the switch $S_2$ turns on since the input digital signal $b_2$ is "1", while all other switches $S_1$, ... $S_{n-1}$, Sn turn off since all the input digital signals $b_1$, ..., $b_{n-1}$, $b_n$ are "0".

Therefore, the voltage drop $V_B$ between the direct current reference voltage source 21 and the node B of the resistor 311 is obtained as follows.

$$V_B = (2/3) \cdot R \cdot I$$

Then, the voltage drops $V_C$, $V_D$ after the states of the node C are obtained, respectively, as follows.

$$V_C = \tfrac{1}{2} \times V_{C-1}$$
$$V_D = \tfrac{1}{2} \times V_C$$

Where, a voltage drop $V_{C-1}$ is a voltage drop at an immediately preceding node to the node C.

Thus, the voltage drops at respective resistors decrease by ½ as it goes down to the respective nodes B, C, and D. Therefore, the analog output voltage Vout at the output terminal 70 is obtained by a general equation (2).

$$\text{Vout} = V - (\tfrac{1}{2}^{n-2}) \cdot (2/3) \cdot R \cdot I \cdot b_2 \tag{2}$$

Where, n is a positive integer number such as 1, 2, 3 ....

(iii) Next, the output voltage, when the input digital signals $b_1$, $b_2$, $b_{n-1}$, $b_n$ are 0, 0, 1, 0, respectively, as shown in FIG. 7, is obtained as follows. In FIG. 7, the switch $S_{n-1}$ turns on since the input digital signal $b_3$ is "1", while all other switches $S_1$, $S_2$, Sn turn off since all the input digital signals $b_1$, $b_2$, $b_n$ are "0".

Therefore, the voltage drop $V_C$ between the direct current reference voltage source 21 and a node C of the resistor 315 is obtained as follows.

$$V_C = (2/3) \cdot R \cdot I$$

Then, the voltage drop $V_D$ at a node D is obtained as follows.

$$V_D = \tfrac{1}{2} \times V_C$$

Thus, the voltage drops at respective resistors decrease by ½ as it goes down to the respective nodes C, D. Therefore, the analog output voltage Vout at the output terminal 70 is obtained by a general equation (3).

$$\text{Vout} = V - (\tfrac{1}{2}^{n-2}) \cdot (2/3) \cdot R \cdot I \cdot b_3 \tag{3}$$

Where, n is a positive integer number, such as 1, 2, 3 ....

(iv) Next, the output voltage, when the input digital signals $b_1$, $b_2$, $b_3$, $b_n$ are 0, 0, 0, 1, respectively, as shown in FIG. 8, is obtained as follows. In FIG. 8, the switch $S_n$ turns on since only the input digital signal $b_n$ is "1", while all other switches $S_1$, $S_2$, $S_{n-1}$ turn off since all the input digital signals $b_1$, $b_2$, $b_3$ are "0".

Therefore, the voltage drop $V_D$ between the node C of the resistor 317 and the direct current reference voltage source 21 is obtained as follows.

$$V_D = (2/3) \cdot R \cdot I$$

Thus, the voltage drops at respective resistors decrease by ½ as it goes down to the respective nodes C, D. Therefore, the output voltage Vout at the output terminal 70 is obtained by a general equation (6).

$$Vout = V - (½^0) \cdot (⅔) \cdot R \cdot I \cdot b_n \tag{4}$$

Where, n is a positive integer number, such as 1, 2, 3 . . . .

According to the above mentioned results, the output voltage Vout is obtained by combining the equations (1)~(4).

$$Vout = V - (⅔) \cdot R \cdot I \cdot \{b_n + (½^1) \cdot b_{n-1} + \ldots + (½^{n-1}) \cdot b_1\} = V - (⅔) \cdot R \cdot I \cdot (½^{n-1}) \cdot \{2^{n-1} \cdot b_n + 2^{n-2} \cdot b_{n-1} \ldots + 2^0 \cdot b_1\} \tag{6}$$

FIG. 9 shows a relationship between the input digital data signals (b1, b2, b3, b4) and the analog output signal Vout, when a value of n of above mentioned digital signals $b_1, b_2, b_3, \ldots b_n$ is 4, for example.

As shown in FIG. 3, when the digital signals $b_1, b_2, b_3, b_4$ are 0, 0, 0, 0, respectively, the output voltage Vout is equal to the voltage V of the direct current reference voltage source 21, since no current flows through $S_1, S_2, S_3$, nor $S4$, respectively.

On the other hand, when the digital signals $b_1, b_2, b_3, b_4$ are 1, 0, 0, 0 as shown in FIG. 5, the output voltage Vout is obtained by substituting 4 for n in the above equation (1).

$$\begin{aligned} Vout &= V - (1/2^{4-1}) \cdot (2/3) \cdot R \cdot I \\ &= V - (1/8) \Delta V \end{aligned} \tag{7}$$

Where, $\Delta V$ is equal to (⅔) R·I and shows a value of a constant voltage drop.

Next, when the digital signals $b_1, b_2, b_3, b_4$ are 0, 1, 0, 0 as shown in FIG. 6, the output voltage Vout is obtained by substituting 4 for n in the above equation (2).

$$\begin{aligned} Vout &= V - (1/2^{4-2}) \cdot (2/3) \cdot R \cdot I \\ &= V - (1/4) \Delta V \end{aligned} \tag{8}$$

Next, when the digital signals $b_1, b_2, b_3, b_4$ are 0, 0, 1, 0 as shown in FIG. 7, the output voltage Vout is obtained by substituting 4 for n in the above equation (3).

$$\begin{aligned} Vout &= V - (1/2^{4-3}) \cdot (2/3) \cdot R \cdot I \\ &= V - (1/2) \Delta V \end{aligned} \tag{9}$$

Then, the output voltage Vout when the digital signals $b_1, b_2, b_3, b_4$ are 0, 0, 0, 1 as shown in FIG. 8 is obtained by substituting 4 for n in the above equation (4).

$$\begin{aligned} Vout &= V - (1/2^0) \cdot (2/3) \cdot R \cdot I \\ &= V - \Delta V \end{aligned} \tag{10}$$

Furthermore, when the digital signals $b_1, b_2, b_3, b_4$ are 1, 1, 0, 0, for example, the output voltage Vout is obtained as follows by superposing the above equation (7) and the above equation (8).

$$Vout = V - (⅛) \Delta V - (¼) \Delta V$$

Furthermore, when the digital signals $b_1, b_2, b_3, b_4$ are 1, 1, 1, 0, for example, the output voltage Vout is obtained by superposing the above equations (7), (8), (9).

$$Vout = V - (⅛) \Delta V - (¼) \Delta V - (½) \Delta V \tag{11}$$

By repeating the above operations, a step output voltage Vout as shown in FIG. 10 is obtained. In FIG. 10, when a combination of the switches $S_1, S_2, \ldots Sn$ in a horizontal axis is (0, 0, 0, 0), for example, an analog voltage in a vertical axis is V. And, when the combination of the switches $S_1, S_2, \ldots Sn$ in the horizontal axis is (0, 1, 0, 0), the analog voltage in the vertical axis is $V - \Delta V$. Where, each unit voltage in the vertical axis is equal to $\Delta V$. Furthermore, when the combination of the switches $S_1, S_2, \ldots Sn$ in the horizontal axis is (1, 1, 1, 1), the analog voltage in the vertical axis shows the lowest voltage VL. By increasing the number of stages of the switches, it is possible to reduce the unit voltage $\Delta V$ (=(⅔)RI), and obtain a smooth analog voltage. Here, the number of the switches is decided by the system requirement. In FIG. 10, the switch marked with a circle means "turns on", while the switch with no mark means "turned off". "On-off" of the respective switches correspond to digital values at the bottom of the matrix table.

FIG. 9 shows an example in which the conventional D/A converter of FIG. 3 is realized in an actual IC circuit. In FIG. 9, the D/A converter comprises direct current reference voltage sources 21 and 22 (each having a voltage V and a voltage Vref), resistors 43–53 (each having resistances R, 2R or $R_E$), and switching transistors (Q1a, Q1b), (Q2a, Q2b) . . . (Qna, Qnb), corresponding to the switches $S_1, S_2, \ldots Sn$ of FIG. 3, respectively. The D/A converter further comprises an output terminal 70 from which an analog output voltage Vout is outputted, input terminals 11, 12, 13, 14, binary digital input signals $b_1, b_2, b_{n-1}, b_n$ inputted into the input terminals 11, 12, 13, 14, respectively, and the analog output voltage Vout of the D/A converter.

Bit information of the digital signals $b_1, b_2, \ldots b_n$ is inputted into the input terminals 11, 12, 13, 14. Binary number logical voltages of "1 or high" or "0 or low" are used as this bit information. For example, when $b_1$ is equal to 1 and $V_{b1} \gg$ Vref, where $V_{b1}$ is a voltage applied to a base of the transistor Q1b and Vref is a voltage of the direct current reference voltage source 22, the transistor Q1b turns on, while the transistor Q1a turns off, and then no current flows through the transistor Q1a.

When $b_1$ is equal to 0 and $V_{b1} \ll$ Vref, where $V_{b1}$ is a voltage applied to a base of the transistor Q1b and Vref is a voltage of the direct current reference voltage source 22, the transistor Q1b turns off, while the transistor Q1a turns on, and therefore, a current $I_C$ flows through the transistor Q1a.

As is clear from the above explanation, turning on of the transistor Q1a is equivalent to turning on of the switch $S_1$ of FIG. 3, therefore, a voltage at a node A of FIG. 9 is the same as that of FIG. 3 as follows.

$$V_A = (⅔) \cdot R \cdot I$$

In the same way, any one of the digital voltage "1" or "0" is applied to the input terminals 11, 12, 13, 14 as digital signals $b_2, b_3, \ldots b_n$. By substituting the current $I_C$ flowing through the respective transistors Q1a, Q2a, . . . Qna by a current I, the above mentioned equation (6) is obtained in the same way as in FIG. 3.

It is generally known that a relationship between a base current $I_B$ and a collector current $I_C$ is expressed as follows.

$$I_C / I_B = h_{FE}$$

Therefore, the collector current $I_C$ of the switching transistor Q1a is obtained as follows.

$$I_C = (Vref - V_{BE}) \cdot h_{FE} / \{R_E \cdot (1 + h_{FE})\} \tag{12}$$

Assuming $I_C = I$ and the equation (12) is substituted for the equation (6), the following equation is obtained.

$$Vout = V - (⅔) \cdot R \cdot (½^{n-1}) \cdot [(Vref - V_{BE}) \cdot h_{FE} / \{R_E \cdot (1 + h_{FE})\}] \cdot \{2^{n-1} \cdot b_n + 2^{n-2} \cdot b_{n-1} + \ldots + 2^0 \cdot b_1\} \tag{13}$$

Since the equation (13) contains the term of $h_{FE}/\{R_E \cdot (1 + h_{FE})\}$, the output voltage Vout depends on $h_{FE}$ of the transistors. Therefore, it has been difficult to obtain the output voltage Vout as initially designed because of the dispersion caused during manufacturing or by the variation of the temperature.

FIG. 11 shows a temperature characteristic in relation to the digital bit input and the analog output voltage Vout in the D/A converters. Since the output voltage Vout depends on $h_{FE}$ of the transistors in the conventional D/A converter as explained above, the output voltage Vout decreases for the same digital input value if the operation temperature of the D/A converter changes from T° C. to T1° C., for example.

Furthermore, since each $h_{FE}$ of the transistors is different because of dispersion caused by the difference of the manufacturing lot, the problem has occurred in that the output voltage Vout of the D/A converter differs from that of another D/A converter even though they operate at the same temperature.

SUMMARY OF THE INVENTION

The present invention aims to solve the above mentioned problems. The present invention provides the D/A converter which does not depend on $h_{FE}$ of the transistor, by adding a control circuit comprising resistors and transistors and an operational amplifier to the conventional D/A converter circuit, by comparing an output of the above mentioned control circuit with a voltage of the reference direct current source by the operational amplifier, and by providing an output of the operational amplifier to the input of the control circuit and the D/A converter.

According to one aspect of the invention, a digital to analog converter includes a ladder circuit comprising resistive elements. Each resistive element includes a first end connected to a first end connected to a first. direct current reference voltage source and a second end. A plurality of switching elements are connected the second ends of the resistors. The switching elements are turned on or turned off by digital bit inputs, comprises. A control voltage generating circuit includes a transistor having the same characteristics as the switching elements in the digital to analog converter and an operational amplifier for comparing a voltage of the transistor with a reference voltage of a second direct current reference voltage source by feeding back the voltage of the transistor. An output of the operational amplifier is used for controlling the switching elements of the digital to analog converter.

According to another aspect of the invention, a digital to analog converter has a control voltage generating circuit, which comprises: a transistor includes a first electrode connected to the first direct current reference voltage source through a resistor and a second electrode connected to ground through a resistor and an operational amplifier. The operational amplifier includes a non-inverted terminal connected to the first electrode of the transistor, an inverted electrode connected to a second direct current reference voltage source, and an output terminal commonly connected to a third electrode of the transistor and control electrodes of the plurality of switching elements of the digital to analog converter. An analog output is obtained from a first electrode of the last stage switching element by turning on or turning off the plurality of switching elements in response to the digital bit inputs.

According to further aspect of the invention, a digital to analog converter having a ladder circuit includes resistive elements. Each resistive element includes a first end connected to a first direct current reference voltage source and a second end. A plurality of switching elements are connected to the second ends. The switching elements comprise first and second transistors. The first transistors have first electrodes connected to nodes on corresponding stages of the ladder circuit, second electrodes connected to ground through resistors, and third electrodes to which control voltages are applied. The second transistors have first electrodes directly connected to the first direct current reference voltage source, second electrodes commonly connected to the second electrodes of the second switching elements, and third electrodes into which digital inputs are inputted. A control voltage generating circuit comprises a transistor having a first electrode connected to the first direct current reference voltage source through a resistor and a second electrode connected to ground through a resistor and an operational amplifier. The operational amplifier includes a non-inverted terminal connected to the first electrode of the transistor, an inverted terminal connected to a second direct current reference voltage source, and an output terminal commonly connected to the third electrode of the transistor and the third electrodes of the second plurality of switching elements. An wherein an analog output is obtained from a first electrode of the last stage switching clement by turning on or turning off the plurality of switching elements in response to the plurality of digital bit inputs through the third switching elements.

According to further aspect of the invention, a digital to analog converter having a ladder circuit includes a plurality of resistive elements. Each resistive element includes a first end connected to a first direct current reference voltage source and a second end. A plurality of switching elements are connected to the second end. The switching elements are turned on or turned off by digital bit inputs. An operational amplifier compares a voltage fed back from the last stage switching element with a voltage of a second direct current reference voltage source. A transistor having same characteristic as that of the switching elements in the digital to analog converter is coupled to the operational amplifier. Output of the operational amplifier is used for controlling the switching elements of the digital to analog converter and the transistor.

According to further aspect of the invention, a digital to analog converter comprises an operational amplifier having a non-inverted terminal connected to a first electrode of the switching element on the last stage. A inverted terminal of the operational amplifier is connected to the second direct current reference voltage source. A transistor includes first and second electrodes. The first electrode is connected to the first direct current reference voltage source through a resistor. The second electrode connected to ground through a resistor. An output terminal of the operational amplifier is commonly connected to control electrodes of the plurality of switching elements in the digital to analog converter and a control electrode of the transistor. An analog output is obtained from the first electrode of the transistor by turning on or turning off the plurality of switching elements by the plurality of digital bit inputs.

According to further aspect of the invention, a digital to analog converter includes a ladder circuit comprising resistive elements. Each resistive element includes a first end connected to a first direct current reference voltage source. A first plurality of switching elements are connected to respective nodes of the ladder circuit which are not connected to the first direct current reference voltage source. The first switching elements comprise first and second transistors. The first transistors have first electrodes connected to respective nodes of the ladder circuit, second electrodes connected to ground through resistors, and third electrodes to which control voltages are applied. The second transistors comprise first electrodes directly connected to the first direct current reference voltage source, second electrodes commonly connected to the second electrodes of the second switching elements, and third electrodes into which digital inputs are inputted. An operational amplifier includes a non-inverted terminal connected to the first electrodes of the first transistors and an inverted terminal connected to a second direct current reference voltage source. A transistor includes a first electrode connected to the first direct current reference voltage source through a resistor, a second electrode connected to ground through a resistor. An output terminal of the operational amplifier is commonly connected to the third electrodes of the second plurality of switching elements and a third electrode of the transistor. An analog output is obtained from the first electrode of the transistor by turning on or turning off the second plurality of switching elements by the plurality of digital bit inputs through the third switching elements.

Preferably, the switching elements and the transistor in the D/A converter are comprised of bipolar transistors, where the first electrodes are collector, the second electrodes are emitters, and the third electrodes are bases.

Preferably, the switching elements and the transistor in the D/A converter are comprised of MOS transistors, where the first electrodes are drains, the second electrodes are sources, and the third electrodes are gates.

DETAILED DESCRIPTION OF THE PREFERRED EMBODIMENTS

Embodiment 1

Figure 1:
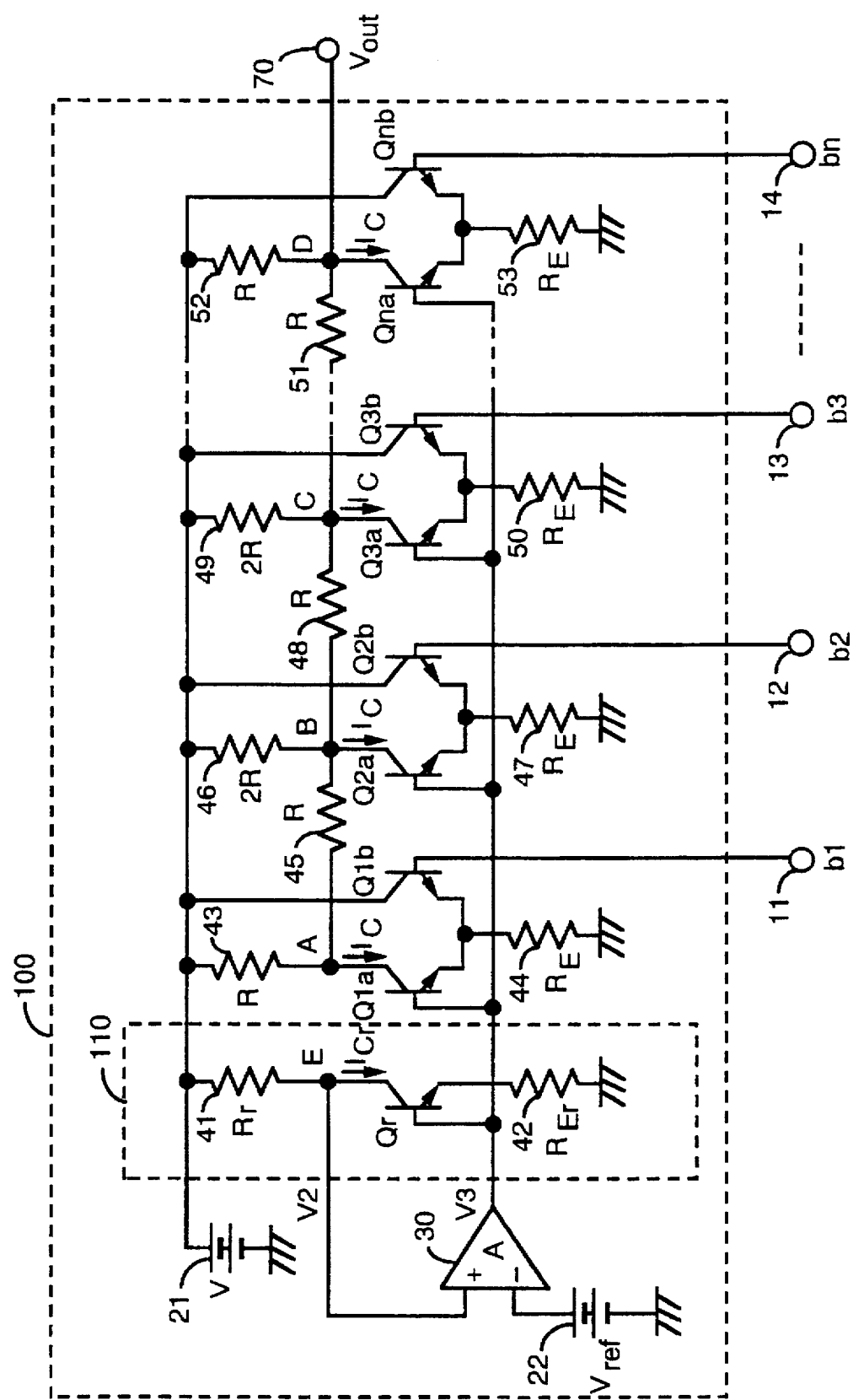
FIG. 1 shows a D/A converter of a first embodiment of the present invention.
Figure 9:
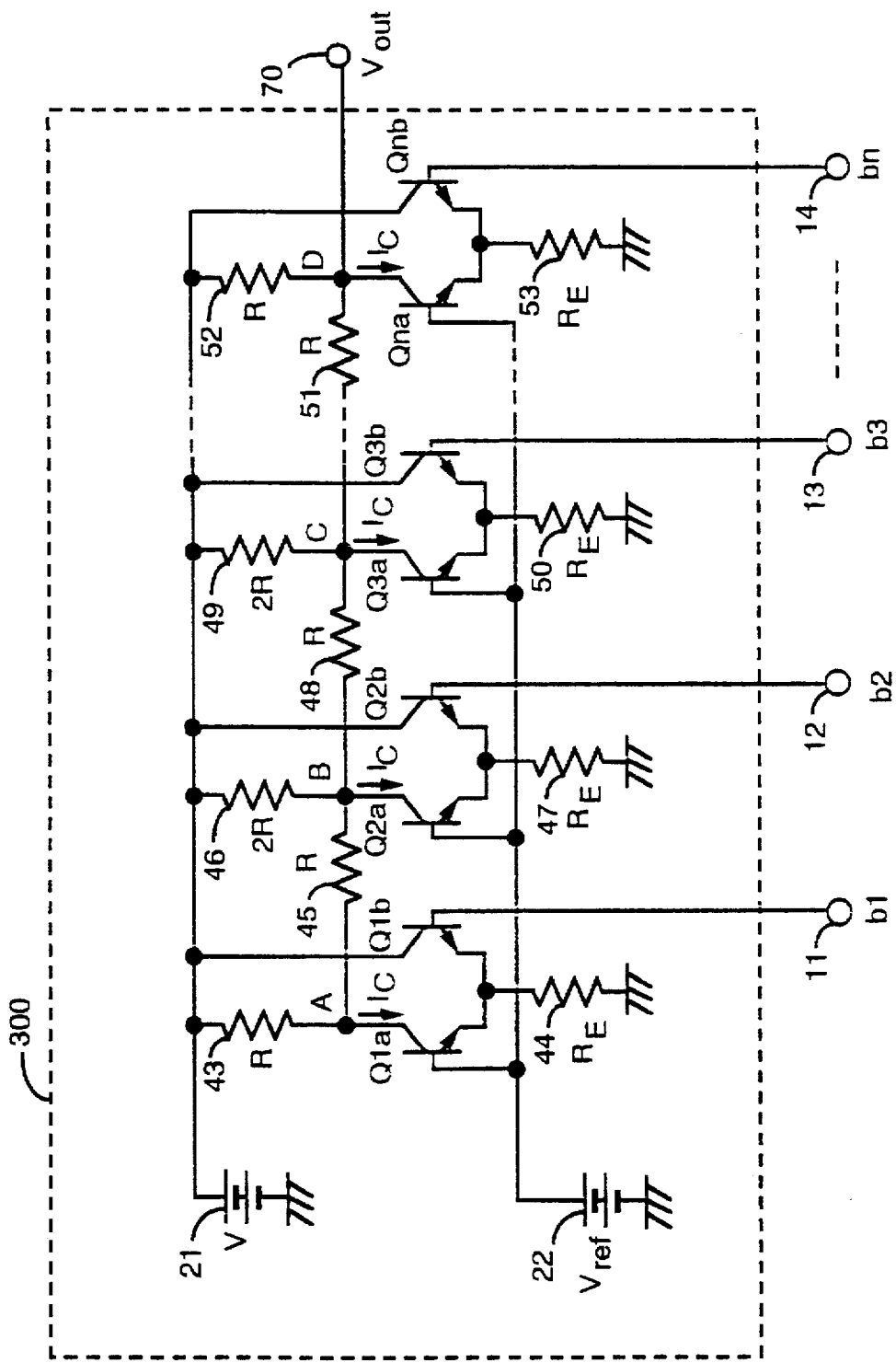
FIG. 9 shows an example in which the D/A converter of FIG. 3 is realized in an actual IC circuit.
Figure 10:
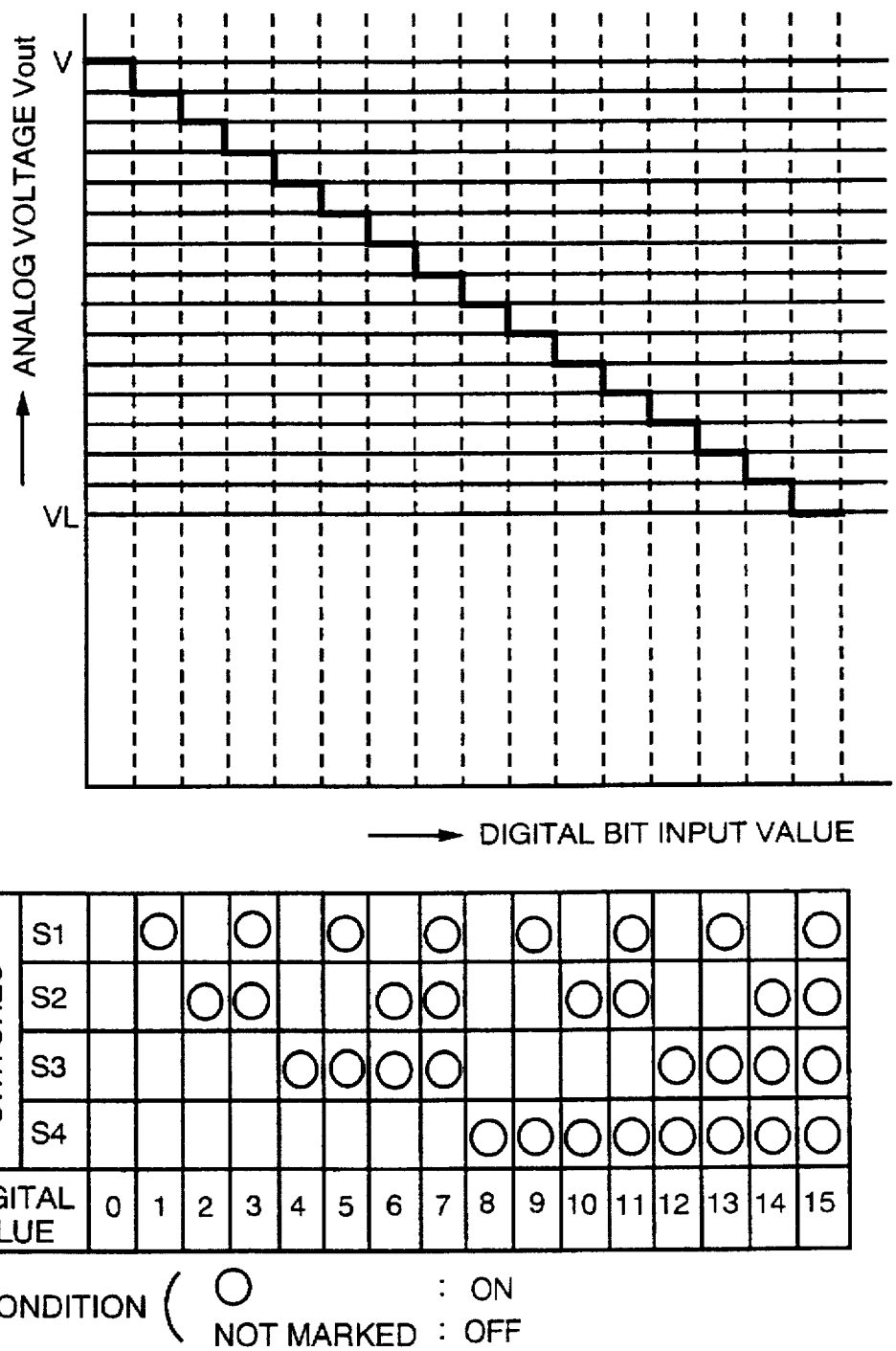
FIG. 10 shows a relationship between a digital bit input and an analog output voltage Vout in a D/A converter.

FIG. 1 shows a circuit configuration of a first embodiment of the present invention. In FIG. 1, a D/A converter comprises a direct current reference voltage sources 21, 22 (each having a voltage V and a voltage Vref), an operational amplifier 30, a transistor Qr, resistances Rr and $R_{Er}$, resistors 43–53 (each having resistances R, 2R, and RE), switching transistors Q1a, Q1b, Q2a, Q2b ... Qna, Qnb, bit information input terminals $b_1, b_2, \ldots b_n$, an output terminal 70, a control circuit 110, and resistors 41, 42 (each having resistances Rr and $R_{Er}$). The elements having the same reference numbers in FIG. 1 are the same portions or the corresponding portions in FIG. 9. Accordingly the detailed explanation of the same portions is omitted.

In FIG. 1, an emitter of the transistor Qr in the control circuit 110 is connected to ground through the resistance $R_{Er}$. A collector of the transistor Qr is connected to the direct current reference voltage source 21 through the resistance Rr and to a non-inverted input terminal of the operational amplifier 30. The direct current reference voltage source 22 having the voltage Vref is connected to an inverted input terminal of the operational amplifier 30. An output of the operational amplifier 30 is connected to a base of the transistor Qr and also to respective bases of the transistors Q1a, Q2a, ... Qna which constitute the D/A converter.

The transistors Q1a, Q2a, ... Qna have respective collectors connected to the direct current reference voltage source 21 through the resistors 43, 46, 49, 52 and respective emitters connected to ground through the resistances $R_E$. The transistors Q1b, Q2b, ... Qnb have respective collectors connected directly to the direct current reference voltage source 21, respective emitters connected to ground together with the emitters of the transistors Q1a, Q2a, ... Qna through the respective resistances $R_E$, and respective bases connected to the digital input terminals $b_1, b_2, b_{n-1}, b_n$ into which one of binary digital input signals "1" and "0" is inputted.

In the operational amplifier 30 of the circuit configuration mentioned above, an output voltage V3 varies so that a collector voltage V2 of the transistor Qr at a node E is equal to the voltage Vref of the direct current reference voltage source. The output voltage V3 of the operational amplifier 30 is provided to all of the bases of the transistors Q1a, Q2a ... Qna which constitute the D/A converter.

The way to obtain an analog output voltage Vout in the D/A converter of the present invention is explained below. In FIG. 1, a collector current $I_{Cr}$ of the transistor Qr is obtained in the first place before computing the output voltage Vout. The output voltage V3 of the operational amplifier 30 is obtained as follows.

$$V3=A(V2-Vref)$$

Therefore, the voltage V2 of the non-inverted terminal of the operational amplifier 30 is obtained as follows.

$$V2=(V3/A)+Vref$$

On the assumption that an amplification factor A of the operational amplifier 30 is infinity (A=∞), the voltage V2 is obtained according to the above equation as follows.

$$V2=Vref$$

Furthermore, the voltage V2 is obtained by subtracting a voltage drop of the resistance Rr caused by the current $I_{Cr}$ flowing through the transistor Qr from a voltage V of the direct current reference voltage source 21.

$$V2=V-Rr\cdot I_{Cr}$$

The current $I_{Cr}$ is obtained by substituting Vref for V2 in the above equation as follows.

$$V-Vref=Rr\cdot I_{Cr}$$

Therefore, $$I_{Cr}=(V-Vref)/Rr \quad (14)$$

Where, A is an amplification factor of the operational amplifier 30, and V is a reference voltage of the direct current reference voltage source 21.

It is apparent from the equation (14) that the collector current $I_{C_r}$ of the transistor Qr does not depend on $h_{FE}$ of the transistor Qr, but is dominated only by the resistance.

On the other hand, since the output voltage V3 of the operational amplifier 30 is provided to the respective bases of the transistors Q1a, Q2a, . . . Qna which constitute the D/A converter, the respective collector currents $I_C$ of the transistors Q1a, Q2a, . . . Qna are proportional to the collector current $I_{C_r}$ of the transistor Qr. Assuming α is a proportional constant, the collector current $I_{C_r}$ is expressed by the following equation (15).

$$I_C \quad (15)$$

Therefore, the output voltage Vout of the D/A converter is obtained as follows using the equations (6), (14), if substituted I for $I_C$.

$$\begin{aligned} Vout &= V - (2/3) \cdot R \cdot I \cdot (1/2^{n-1}) \cdot \\ & \quad \{2^{n-1} \cdot b_n + 2^{n-2} \cdot b_{n-1} + \ldots + 2^0 \cdot b_1\} \\ &= V - (2/3) \cdot R \cdot \alpha \cdot (V - Vref)/r \cdot (1/2^{n-1}) \cdot \\ & \quad \{2^{n-1} \cdot b_n + 2^{n-1} \cdot b_{n-1} + \ldots + 2^0 \cdot b_1\} \\ &= V - (2/3) \cdot \alpha \cdot (V - Vref) \cdot (R/Rr) \cdot (1/2^{n-1}) \\ & \quad \{2^{n-1} \cdot b_n + 2^{n-2} \cdot b_{n-1} + \ldots + 2^0 \cdot b_1\} \end{aligned} \quad (16)$$

By using elements of the same characteristics (constructed in the same diffusion condition, for example) such as the same resistance values R and Rr, dispersion caused during manufacturing and a temperature coefficient are of the same inclination. Therefore, (R/Rr) becomes constant.

Therefore, the equation (16), the analog output voltage Vout of the D/A converter is determined only by the voltages V, Vref of the direct current reference voltage sources, but not depending on $h_{FE}$ of the transistor.

Figure 11:
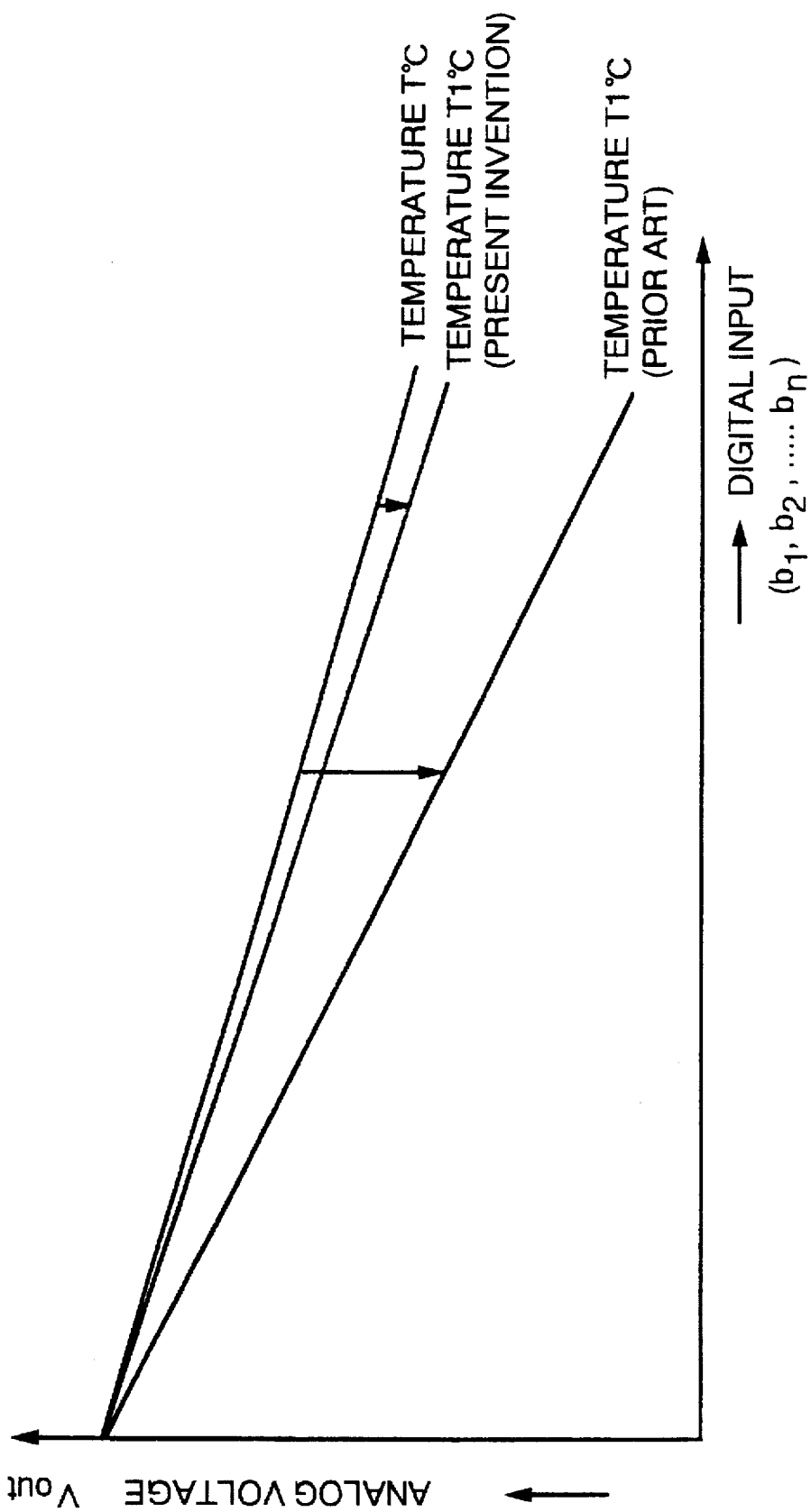
FIG. 11 shows a temperature characteristic of a digital bit input and an analog output voltage Vout in D/A converters.

FIG. 11 shows a temperature characteristic of the analog output voltage Vout for the digital bit input in the D/A converter of the present invention as well as the temperature characteristic of the analog output voltage Vout for the digital bit input in the conventional D/A converter. As explained above, since the output voltage Vout of the D/A converter of the present invention does not depend on $h_{FE}$ of the transistor, the variation of the output voltage Vout is very small even if the temperature of the D/A converter changes from T° C. to T1° C.

Since the output voltage Vout of the present invention is not influenced by $h_{FE}$ of the transistor as explained above, it is advantageous that the analog output voltage Vout varies little even if $h_{FE}$ of the transistor varies because of dispersion caused during manufacturing or even if the D/A converter in the apparatus is exchanged for another one.

Figure 12:
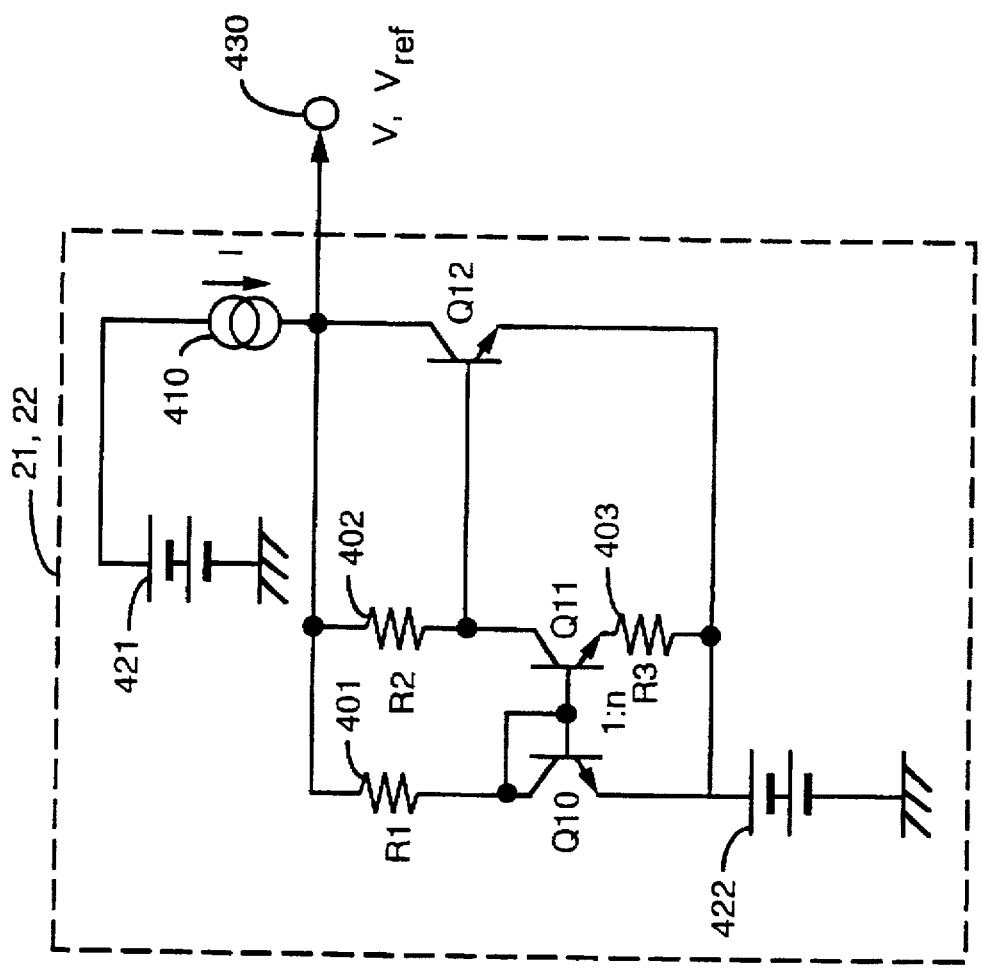
FIG. 12 shows an example of a circuit configuration of a direct current reference voltage source used in a D/A converter.

The direct current reference voltage sources 21, 22 may be substituted by band-gap reference voltage generating circuits shown in FIG. 12. In FIG. 12, the band-gap reference voltage generating circuit comprises resistors 401, 402, 403, voltage sources 421, 422, transistors Q10, Q11, Q12, a constant current source 410, and an output terminal 430 of the direct current reference voltage source. In FIG. 12, output voltage Vref is obtained as follows.

$$Vref = (R2/R3) \cdot (kT/q) \cdot \ln(n \cdot R2/R1) + V_{BE3}$$

In the above equation, the output voltage Vref is determined by R2/R3, R2/R1, and $V_{BE3}$, since (kT/q) is constant. If these resistive elements 401–403 are formed on the same substrate, since resistive varying components of resistors R1, R2, R3 caused by temperature have the same temperature coefficient, the ratios of the resistors R2/R3 and R2/R1 are independent of the temperature. In addition, since $V_{BE3}$ is a base-emitter voltage of the transistor Q11 and is constant, the output voltage Vref is constant. Since this band-gap reference voltage generating circuit is well known as a constant voltage source, further explanation is omitted.

Embodiment 2

Figure 2:
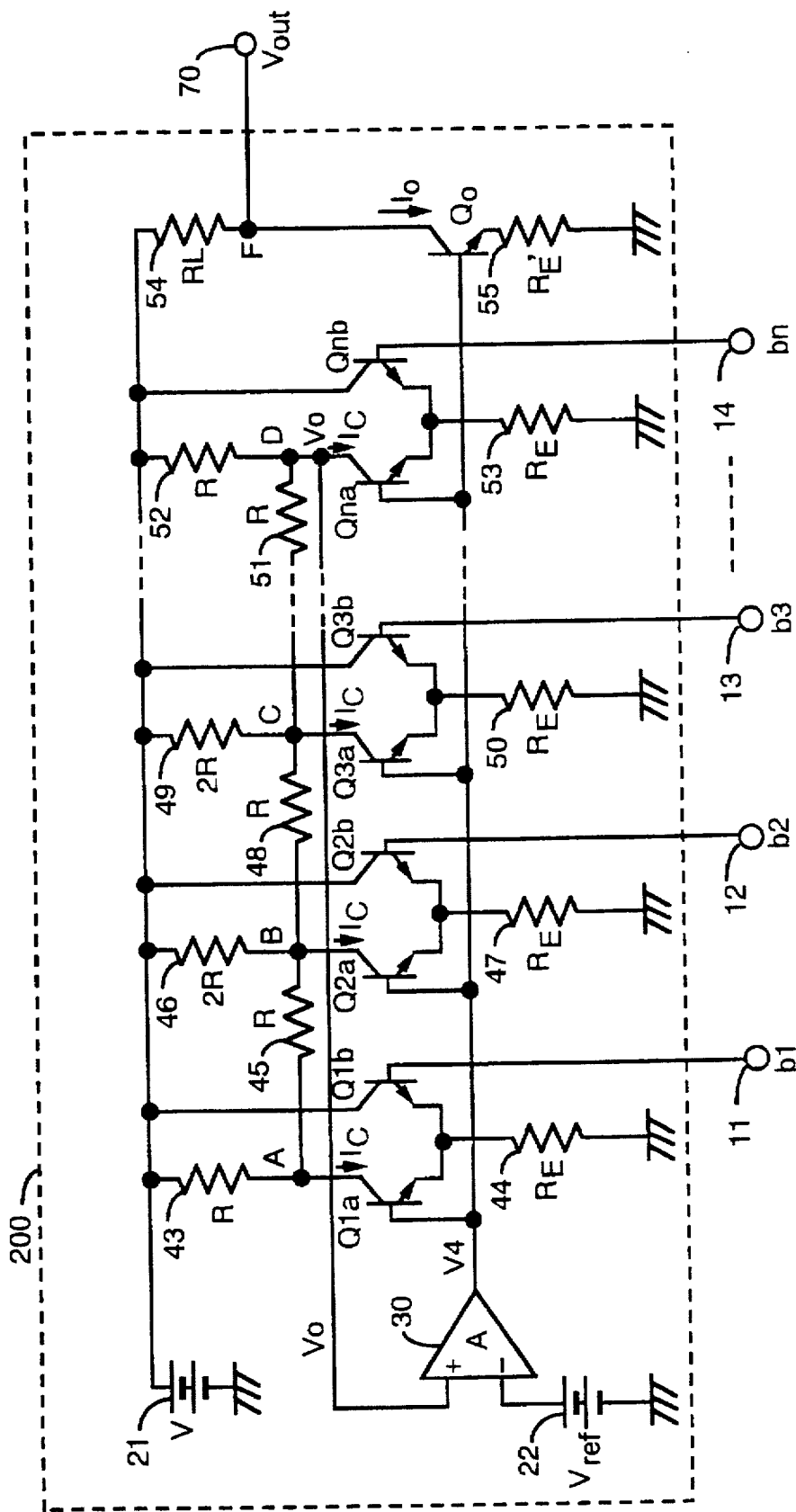
FIG. 2 shows a D/A converter of a second embodiment of the present invention.
Figure 3:
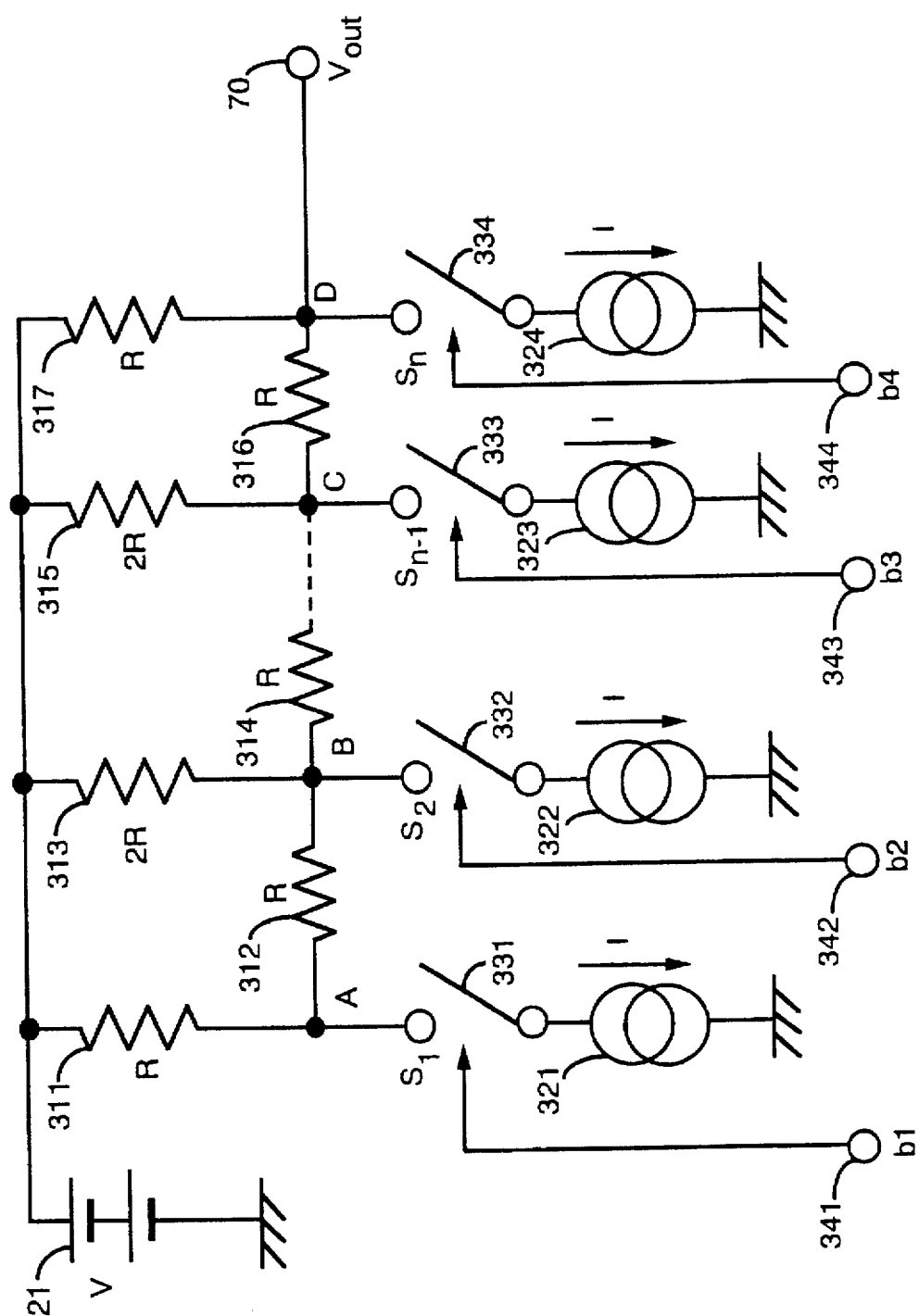
FIG. 3 is a circuit configuration for explaining an operational logic of a D/A converter.
Figure 4:
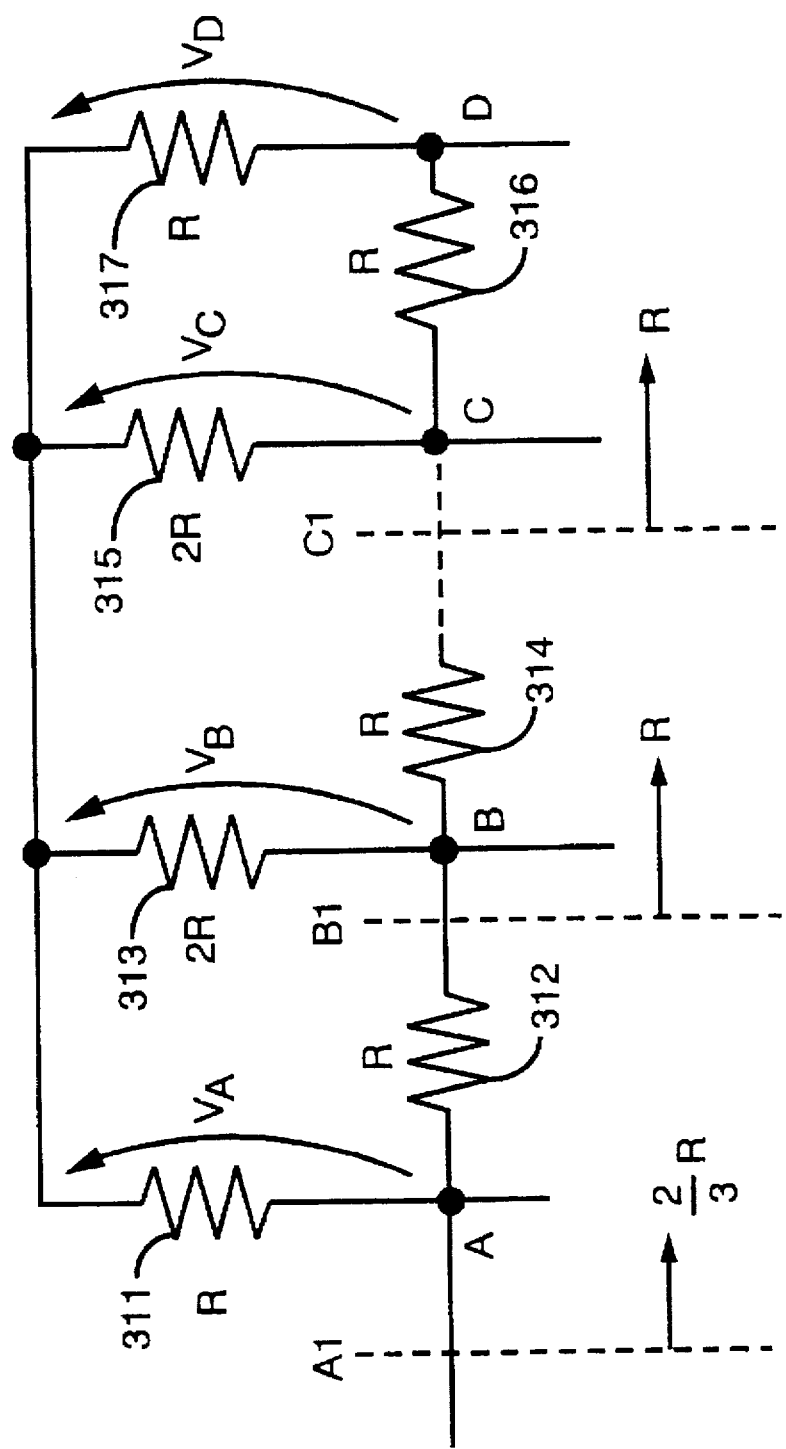
FIG. 4 is a circuit configuration for obtaining impedances at respective nodes in FIG. 3.
Figure 5:
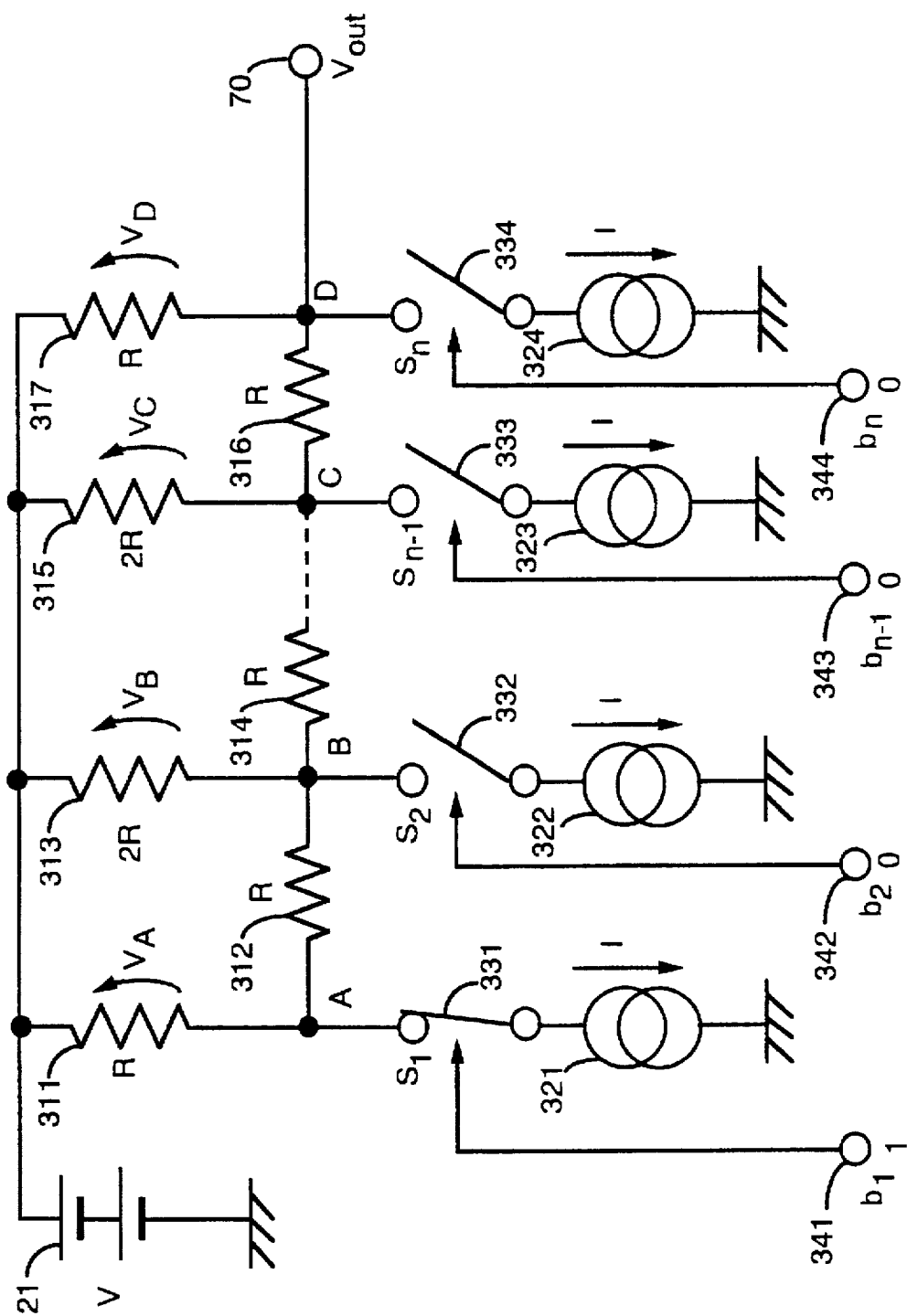
FIG. 5 is a circuit configuration for explaining an operational logic of a D/A converter.
Figure 6:
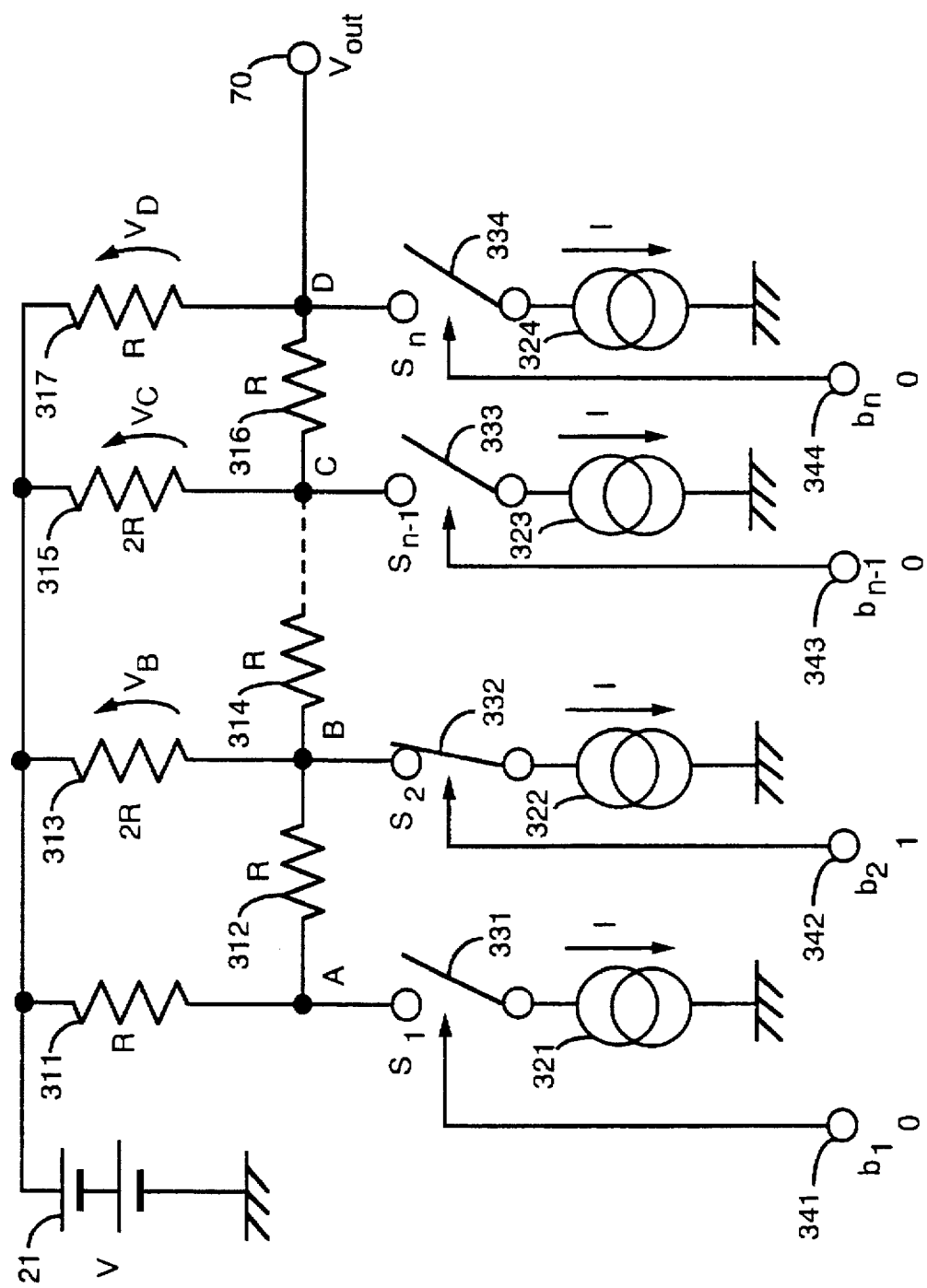
FIG. 6 is a circuit configuration for explaining an operational logic of a D/A converter.
Figure 7:
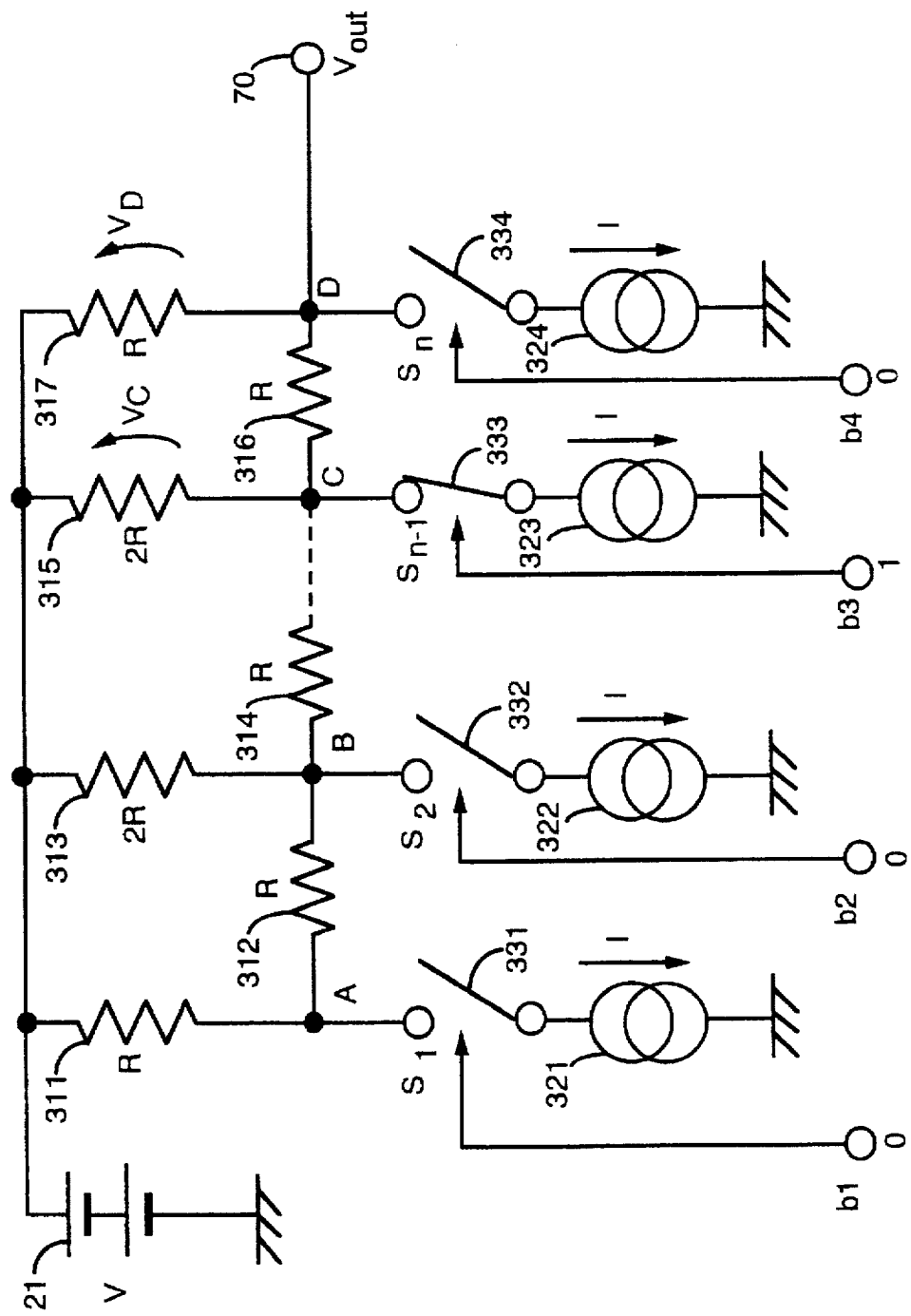
FIG. 7 is a circuit configuration for explaining an operational logic of a D/A converter.
Figure 8:
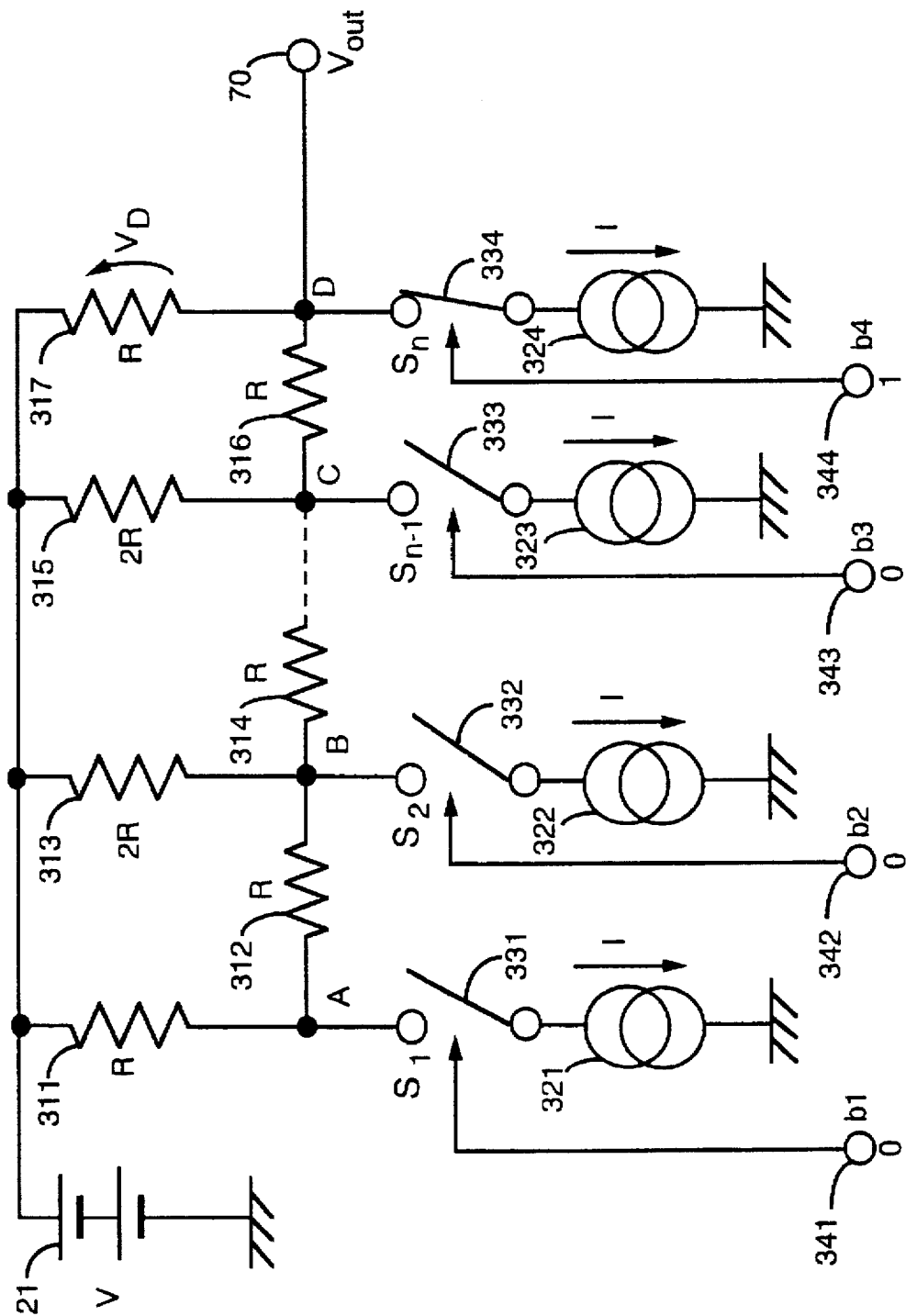
FIG. 8 is a circuit configuration for explaining an operational logic of a D/A converter.

FIG. 2 shows a D/A converter of a second invention of the present invention. The D/A converter comprises a transistor Qo, resistances $R_E'$, RL, and an analog output voltage Vout of the D/A converter. The elements having the same reference numbers in FIG. 2 are the same portions or the corresponding portions in FIG. 1. Accordingly the detailed explanation of the same portions is omitted.

In FIG. 2, a collector of a transistor Qna is connected to a non-inverted input terminal of an operational amplifier 30. A direct current reference voltage source 22 having a reference voltage Vref is connected to an inverted input terminal of the operational amplifier 30. Output of the operational amplifier 30 is provided to respective bases of transistors Q1a, Q2a, . . . Qna which constitute the D/A converter. An output voltage V4 of the operational amplifier 30 is also provided to a base of the transistor Qo. An output terminal 70 is a terminal from which the output voltage Vout is outputted. Binary digital input signals $b_1$, $b_2$, $b_3$, $b_n$ are inputted into input terminals 11, 12, 13, 14, respectively.

The transistors Q1a, Q2a, . . . Qna have respective collectors connected to a direct current reference voltage source 21 through the respective resistors 43, 46, 49, 52 and respective emitters connected to ground through resistances $R_E$. Transistors Q1b, Q2b, . . . Qnb have respective collectors directly connected to the direct current reference voltage source 21, emitters connected to ground together with the emitters of the transistors Q1a, Q2a . . . Qna through the resistances $R_E$, and respective bases connected to the digital input terminals 11–14 into which one of binary digital input signals "1" and "0" is inputted.

Here, the respective transistors Q1a, Q2a . . . Qna turn on when the respective binary digital input signals $b_1$, $b_2$, . . . $b_n$ are "1" and turn off when the respective binary digital input signals $b_1$, $b_2$, . . . $b_n$ are "0".

In the operational amplifier 30 of the circuit configuration explained above, the output voltage V4 of the operational amplifier 30 varies so that a collector voltage Vo of the collector (at a node D) of the transistor Qna becomes equal to the voltage Vref of the direct current reference voltage source 22. The output voltage V4 of the operational amplifier 30 is provided to all of the bases of the transistors Q1a, Q2a, . . . Qna which constitute the D/A converter.

The transistor Qo has a collector connected to the direct current reference voltage source 21 through the resistance RL and an emitter connected to ground through the resistance $R_E'$.

By connecting the operational amplifier 30 as shown in FIG. 2, the output voltage V4 of the operational amplifier 30 is controlled so that the output terminal voltage Vo of the transistor Qna is equal to the voltage Vref of the direct current reference voltage source 22. This output voltage V4 of the operational amplifier 30 is also provided to the base of the transistor Qo.

The output voltage Vout of the D/A converter in FIG. 2 is computed as follows. First, the output voltage V4 of the operational amplifier 30 is decided. The output voltage Vo of the transistor Qna is fed back to the non-inverted terminal of the operational amplifier 30, and the output voltage Vo of the transistor Qna is thereby controlled to be equal to the voltage Vref of the direct current reference voltage source 22. Therefore, an equation (17) is obtained.

$$Vo = Vref \quad (17)$$

By substituting the equation (17) for the equation (13) and assuming Vref=V4, an equation (18) is obtained.

$$Vo = Vref = V - (\tfrac{2}{3}) \cdot R \cdot (\tfrac{1}{2}^{n-1}) \cdot \{(V4 - V_{BE}) \cdot h_{FE}/\{R_E' \cdot (1 + h_{FE})\}\} \cdot \{2^{n-1} \cdot b_n + 2^{n-2} \cdot b_{n-1} + \ldots + 2^0 b_1\}) \quad (18)$$

Therefore, the output voltage V4 of the operational amplifier 30 is obtained as an equation (19) by deforming the equation (18).

$$V4 = (\tfrac{2}{3}) \cdot 2^{n-1} \cdot (V - Vref) \cdot (R_E'/R) \cdot \{(1 + h_{FE})/h_{FE}\}/B + V_{BE} \quad (19)$$

Where, $B = 2^{n-1} \cdot b_n + 2^{n-2} \cdot b_{n-1} + \ldots + 2^0 \cdot b_1$

On the other hand, a collector current Io of the transistor Qo is obtained as follows by substituting Io for $I_C$ and V4 for Vref in the equation (12).

$$Io = (V4 - V_{BE}) \cdot h_{FE}/\{R_E' \cdot (1 + h_{FE})\} \quad (20)$$

An equation (21) is obtained by substituting the equation (19) for the equation (20).

$$Io = (1/R_E') \cdot \{(\tfrac{2}{3}) \cdot 2^{n-1} \cdot (V - Vref) \cdot (R_E'/R) \cdot ((1 + h_{FE})/h_{FE})/B + V_{BE} - V_{BE}\} \cdot h_{FE}/\{R_E' \cdot (1 + h_{FE})\} = (\tfrac{2}{3}) \cdot 2^{n-1} \cdot (V - Vref) \cdot (1/R) \cdot (1/B) \quad (21)$$

Therefore, the analog output terminal voltage Vout of the D/A converter is obtained as follows.

$$Vout = V - RL \cdot Io \quad (22)$$

An equation (23) is obtained by substituting the equation (21) for the equation (22).

$$\begin{aligned} Vout &= V - RL \cdot Io = V - (3/2) \cdot 2^{n-1} \cdot (V - Vref) \cdot (RL/R) \cdot (1/B) \\ &= V - (3/2) \cdot 2^{n-1} \cdot (V - Vref) \cdot (RL/R) \cdot \\ & \quad \{1/(2^{n-1} \cdot b_n + 2^{n-2} \cdot b_{n-1} + \ldots + 2^0 \cdot b_1)\} \end{aligned} \quad (23)$$

In the equation (23), by using elements of the same characteristics (constructed in the same diffusion condition, for example) such as the same resistance values R and RL, dispersion caused during manufacturing and a temperature coefficient are of the same inclination. Therefore, (R/Rr) becomes constant. In this way, it is apparent from the equation (23) that the output terminal voltage Vout does not depend on $h_{FE}$ of the transistors, since the output terminal voltage Vout is determined only by the voltages V, Vref of the respective direct current reference voltage sources 21, 22.

What is claimed is:

1. A digital-to-analog converter comprising:
   a ladder circuit including:
     a first direct current reference voltage source producing a first reference voltage,
     a plurality of first resistive elements, each first resistive element having a first end connected to the first direct current reference voltage source and a second end,
     a plurality of second resistive elements, each second resistive element being connected between second ends of a respective pair of the first resistive elements, and
     a plurality of switching elements, each switching element being connected to the second end of a respective first resistive element, the respective switching elements having respective control electrodes and being turned on and off by corresponding digital input bits applied to the control electrodes; and
   a control voltage generating circuit including:
     a second direct current reference voltage source producing a second reference voltage,
     first and second resistors,
     a transistor including a first electrode connected to the first direct current reference voltage source through the first resistor, a second electrode connected to ground through the second resistor, and a third electrode, and
     an operational amplifier for comparing a voltage across the first and third electrodes of the transistor with the second reference voltage wherein an output of the operational amplifier is used for controlling the switching elements, the operational amplifier including a non-inverting terminal connected to the first electrode of the transistor, an inverting terminal connected to the second direct current reference voltage source, and an output terminal commonly connected to the third electrode of the transistor and the control electrodes of the switching elements.

2. The digital-to-analog converter according to claim 1 wherein the switching elements and the transistor comprise bipolar transistors.

3. The digital-to-analog converter according to claim 1 wherein the switching elements and the transistor comprise MOS transistors.

4. A digital-to-analog converter comprising:
   a ladder circuit including:
     a first direct current reference voltage source producing a first reference voltage,
     a plurality of first resistive elements, each first resistive element having a first end connected to the first direct current reference voltage source and a second end,
     a plurality of second resistive elements, each second resistive element being connected between second ends of a respective pair of the first resistive elements, and
     a plurality of switching elements, each switching element being connected to the second ends of the first resistive elements, the switching elements each including:
       first and second transistors, wherein each of the first transistors has a first electrode connected to the second end of a respective first resistive element, a second electrode connected to ground through a grounding resistor, and a third electrode to which a control voltage is applied, and each of the second transistors has a first electrode directly connected to the first direct current reference voltage source, a second electrode commonly connected to the second electrode of a respective first transistor, and a third electrode into which a plurality of digital input bits are input; and
   a control voltage generating circuit including:
     a second direct current reference voltage source,
     first and second resistors,
     a transistor having a first electrode connected to the first direct current reference voltage source through the first resistor, a second electrode connected to ground through the second resistor, and a third electrode, and
     an operational amplifier having a non-inverting terminal connected to the first electrode of the transistor, an inverting terminal connected to the second direct current reference voltage source, and an output terminal commonly connected to the third electrode of the transistor and the third electrodes of the first transistors, wherein an analog output is obtained from a first electrode of a last stage of the plurality of switching elements by turning on and off the plurality of switching elements in response to the plurality of digital input bits input to respective third electrodes of the second transistors.

5. The digital-to-analog converter according to claim 4 wherein the switching elements and the transistor comprise bipolar transistors, the first electrodes are collectors, the second electrodes are emitters, and the third electrodes are bases.

6. The digital-to-analog converter according to claim 4 wherein the switching elements and the transistor comprise MOS transistors, the first electrodes are drains, the second electrodes are sources, and the third electrodes are gates.

7. A digital-to-analog converter comprising:
   a ladder circuit including:
      a first direct current reference voltage source producing a first reference voltage,
      a plurality of first resistive elements, each first resistive element having a first end connected to the first direct current reference voltage source and a second end,
      a plurality of second resistive elements, each second resistive element being connected between second ends of a respective pair of the first resistive elements, and
      a plurality of switching elements, each switching element being connected to the second end of a respective first resistive element, the respective switching elements having respective control electrodes and being turned on and off by corresponding digital input bits applied to the control electrodes; and
   a control voltage generating circuit including:
      a second direct current reference voltage source,
      an operational amplifier for comparing a voltage fed back from a last stage of the plurality of switching elements with the second reference voltage, and
      a transistor, wherein an output of the operational amplifier is used for controlling the switching elements.

8. The digital-to-analog converter according to claim 7 wherein:
   the control voltage generating circuit further comprises first and second resistors;
   the operational amplifier includes a non-inverting terminal connected to a first electrode of the last stage of the plurality of switching elements, and an inverting terminal connected to the second direct current reference voltage source, and an output terminal commonly connected to control electrodes of the plurality of switching elements; and
   the transistor includes a first electrode connected to the first direct current reference voltage source through the first resistor, a second electrode connected to ground through the second, a third electrode connected to the output terminal of the operational amplifier, wherein an analog output is obtained from the first electrode of the transistor by turning on and off the plurality of switching elements in response to the plurality of digital input bits.

9. The digital-to-analog converter according to claim 8 wherein the switching elements and the transistor comprise bipolar transistors.

10. The digital-to-analog converter according to claim 8 wherein the switching elements and the transistor comprise MOS transistors.

11. The digital-to-analog converter according to claim 7 wherein the switching elements and the transistor comprise MOS transistors.

12. The digital-to-analog converter according to claim 7 wherein the switching elements and the transistor comprise bipolar transistors.

13. A digital-to-analog converter comprising:
   a ladder circuit including:
      a first direct current reference voltage source producing a first reference voltage,
      a plurality of first resistive elements, each first resistive element having a first end connected to the first direct current reference voltage source and a second end,
      a plurality of second resistive elements, each second resistive element being connected between second ends of a respective pair of the first resistive elements, and
      a plurality of switching elements connected to the second end of a respective first resistive element, each of the switching elements including:
         first and second transistors, the first transistors each having a first electrode connected to a second end of a respective first resistive element, a second electrode connected to ground through a respective resistor, and a third electrode to which a control voltage is applied, and the second transistors each having a first electrode directly connected to the first direct current reference voltage source, a second electrode commonly connected to the second electrode of a respective first transistor, and a third electrode to which digital input bits are input;
   a control voltage generating circuit including:
      a second direct current reference voltage source producing a second reference voltage;
      first and second resistors;
      an operational amplifier having a non-inverting terminal and an inverting terminal connected to a second direct current reference voltage source, and an output terminal commonly connected to the third electrodes of the plurality of first transistors, and
      a transistor having a first electrode connected to the first direct current reference voltage source through the first resistor, a second electrode connected to ground through the second resistor, and a third electrode connected to the output terminal of the operational amplifier, wherein an analog output is obtained from the first electrode of the transistor by turning on and off the first transistors in response to digital input bits input to the third electrodes of the second transistors.

14. The digital-to-analog converter according to claim 13 wherein the switching elements and the transistor comprise bipolar transistors, the first electrodes are collectors, the second electrodes are emitters, and the third electrodes are bases.

15. The digital-to-analog converter according to claim 13 wherein the switching elements and the transistor comprise MOS transistors, the first electrodes are drains, the second electrodes are sources, and the third electrodes are gates.

* * * * *